United States Patent [19]

Imthurn et al.

[11] Patent Number: 5,441,591
[45] Date of Patent: Aug. 15, 1995

[54] SILICON TO SAPPHIRE BOND

[75] Inventors: George P. Imthurn; Howard Walker, both of San Diego, Calif.

[73] Assignee: The United States of America as represented by the Secretary of the Navy, Washington, D.C.

[21] Appl. No.: 74,515

[22] Filed: Jun. 7, 1993

[51] Int. Cl.$^6$ .......................................... H01L 21/304
[52] U.S. Cl. .................. 156/153; 156/281; 437/974; 437/921; 437/225; 437/21; 148/DIG. 12; 148/DIG. 135; 148/DIG. 150
[58] Field of Search ............................. 156/153, 281; 148/DIG. 12, DIG. 135, DIG. 150; 437/225, 974, 921, 21

[56] References Cited

U.S. PATENT DOCUMENTS

| | | |
|---|---|---|
| 2,977,417 | 3/1961 | Doelz et al. . |
| 3,123,953 | 3/1964 | Merkl . |
| 4,671,846 | 6/1987 | Shimbo et al. .................. 156/153 X |
| 4,883,215 | 11/1989 | Goesele et al. . |
| 4,897,362 | 1/1990 | Delgado et al. . |
| 4,939,101 | 7/1990 | Black et al. .................. 148/DIG. 12 |
| 4,962,879 | 10/1990 | Goesele et al. . |
| 5,013,380 | 5/1991 | Aoshima .......................... 156/256 X |
| 5,054,683 | 10/1991 | Haisma et al. ......... 148/DIG. 133 X |
| 5,086,011 | 2/1992 | Shiota . |
| 5,152,857 | 10/1992 | Ito et al. . |
| 5,160,560 | 11/1992 | Welkowsky et al. . |
| 5,162,251 | 11/1992 | Poole et al. . |
| 5,169,472 | 12/1992 | Goebel . |
| 5,330,918 | 7/1994 | Dubbelday et al. ... 148/DIG. 12 X |

OTHER PUBLICATIONS

Haisma, J. et al, "Silicon-on-Insulator Wafer Bonding-Wafer Thinning Technological Evaluations," Japanese Journal of Applied Physics, vol. 28, No. 8, Aug. 1989, pp. 1426-1443.

G. P. Imthurn, G. A. Garcia, H. W. Walker, and L. Forbes, "Bonded Silicon-On-Sapphire Wafers and Devices", *J. Appl. Phys.*, 72(6), 15 Sep. 1992, pp. 2526-2527.

W. P. Maszara, G. Goetz, A. Caviglia, and J. B. McKitterick, "Bonding of Silicon Wafers for Silicon-On-Insulator", *J. Appl. Phys.*, 64(10), 15 Nov. 1988, pp. 4943-4950.

*Primary Examiner*—Jeff H. Aftergut
*Attorney, Agent, or Firm*—Harvey Fendelman; Thomas Glenn Keough; Peter A. Lipovsky

[57] ABSTRACT

A method of bonding silicon to sapphire may be performed at room temperature and with no greater pressure than that due to one wafer resting on another. The method comprises the steps of polishing one side of a flat sapphire wafer to a mirror-like surface; polishing one side of a flat silicon wafer to a mirror-like surface; cleaning the wafers and then stacking the wafers so that their corresponding mirror-like surfaces contact. The room temperature bonding that occurs is relatively strong, and the bonded wafers can be handled without danger of their becoming unbonded. If desired, the bonded wafers may be subjected to further processing to further strengthen their bond.

14 Claims, No Drawings

SILICON TO SAPPHIRE BOND

STATEMENT OF GOVERNMENT INTEREST

The invention described herein may be manufactured and used by or for the Government of the United States of America for governmental purposes without the payment of any royalties thereon or therefor.

DOCUMENT INCORPORATED BY REFERENCE

The following document is hereby incorporated by reference into this specification: G. P. Imthurn, G. A. Garcia, H. W. Walker, and L. Forbes, "Bonded silicon-on-sapphire wafers and devices", J. Appl. Phys., vol. 72, no. 6, pp. 2526–2527, (1992).

BACKGROUND OF THE INVENTION

1. Field of the Invention

This invention relates generally to the field of semiconductors and specifically to a method for bonding silicon to sapphire.

2. Description of the Related Art

There are many reasons to integrate electronics in a thin film of silicon on top of an insulating substrate. Among these are increased radiation hardness, enhanced speed, higher levels of integration, and backside illumination useful for optical detectors.

Silicon On Insulator (SOI) materials have been obtained through a variety of methods. In one technique, silicon is epitaxially grown on sapphire. This technology, known as SOS, has proven useful for some applications but has been limited due to crystalline defects.

Another SOI technology is Separation by IMplanted OXygen (SIMOX). SIMOX is formed by implanting oxygen atoms into a silicon substrate. SIMOX has some of the desirable qualities of an ideal SOI, but falls short because it is time consuming to make, has a large number of impurities, and does not have a fully insulating substrate.

The Bond and Etchback Silicon On Insulator (BESOI) process is a method in which two polished silicon wafers, with an oxide layer formed on each, area placed with their polished, oxide surfaces together. The wafers are then heated to form a strong bond. One of the wafers is thinned and electronic devices are fabricated on the thinned wafer.

The BESOI technique provides very high quality silicon; however, the disadvantages of this technique are that the underlying bulk silicon wafer is coupled capacitively with the electronics on the device wafer, and that the silicon is not transparent to visible light, preventing backside illumination of electro-optical circuitry.

By using the process of bonding to adhere silicon to an insulating substrate of sapphire, a thin film of silicon on an insulator is possible, allowing devices such as high quality bipolar transistors and backside illuminated charged coupled devices (CCD) to be made.

SUMMARY OF THE INVENTION

The invention is a :method of bonding silicon to sapphire. The method may be performed at room temperature without the addition of heat and with no greater pressure than that due to one wafer resting on another. Briefly, the method comprises the steps of polishing one side of a flat sapphire wafer to a mirror-like surface; polishing one side of a flat silicon wafer to a mirror-like surface; cleaning the wafers and then stacking the wafers so that their corresponding mirror-like surfaces contact.

In this process, the sapphire and silicon wafers are put through a thorough cleaning step. One cleaned wafer is placed polished side up on a clean surface and then the other cleaned wafer is placed polished side down on top of the first wafer. It is not necessary to initiate the bonding by pressing the wafers together, though this may be done if desired.

The room temperature bonding that occurs is relatively strong, and the bonded wafers can be handled without danger of their becoming unbonded. If desired, the bonded wafers may be subjected to further processing to further strengthen their bond.

OBJECTS OF THE INVENTION

It is an object of this invention to provide a Silicon On Insulator material that has a relatively high radiation hardness.

Another object of the invention is to provide a Silicon On Insulator material that permits electronics integrated thereon to have a relatively high speed.

A further object of the invention is to provide a Silicon On Insulator material that permits relatively high levels of electronics integration.

Yet a further object of this invention is to provide a Silicon On Insulator material that permits backside illumination of optical detectors placed thereon.

Still a another object of the invention is to provide a Silicon On Insulator material that experiences very little parasitic capacitance.

Another object of this invention is to provide a Silicon On Sapphire material in which the silicon does not need to be lattice matched with its sapphire substrate.

Yet another object of the present invention is to provide a silicon on sapphire material that permits silicon to be epitaxially grown on the sapphire substrate.

Other objects, advantages and new features of the invention will become apparent from the following detailed description of the invention.

DESCRIPTION OF THE PREFERRED EMBODIMENT

The method of bonding silicon to sapphire according to the invention is as follows:

A sapphire wafer to be used in the bonding must be flat and polished to a mirror-like surface on at least one side. A silicon wafer to be used in the bonding must also meet these requirements. A polished surface found suitable for use in the invention conforms to the Semiconductor Equipment and Materials International standard SEMI M1-89, for example. Of course a better polish will suffice, and even a lesser polish may prove adequate.

An oxide layer on the silicon wafer is not needed, however, silicon dioxide $SiO_2$ on the polished surface of the silicon wafer will not impede the bonding of the silicon to sapphire. This $SiO_2$ layer can be as thin as a native oxide or it can be made much thicker.

To enhance the bonding of the silicon to sapphire, a cleaning process is used. One such process is the hydrofluoric acid, hydrogen peroxide, and ammonium hydroxide cleaning process often referred to as the RCA clean. Another cleaning process that may be used is that of just hydrogen peroxide and ammonium hydroxide. This is sometimes called a hydrophilization bath. After either of these cleaning operations the wafers are rinsed in de-ionized water, and dried with heated nitrogen.

Because of the strength of the bond formed between the sapphire and the silicon or the sapphire and the oxide on the silicon, and because of the large difference in the thermal expansion coefficients of silicon and sapphire, the silicon or even the sapphire may crack if the bonded wafer is taken to a high temperature and then cooled.

To prevent this, the silicon can be thinned before high temperature processing. This can be accomplished in a variety of ways known to those skilled in the art including mechanical removal of material or by chemical etching. Strain in the silicon can be relieved by removing the silicon from all areas where not needed, leaving islands of silicon on the sapphire. Strain between the silicon and the sapphire may be released by an intervening oxide layer. Alternatively, a low melting temperature glass may be used to relieve stress. In another scheme, grooves may be etched in the silicon prior to bonding to ensure that cracking will take place in regions not critical to the wafer, such as along scribe lines, for example.

An advantage of the silicon to sapphire bond disclosed herein over that of the epitaxial growth of Silicon On Sapphire is that the bulk silicon used in the invention need not be lattice matched with its sapphire substrate. This feature allows thick films of Silicon On Sapphire without the strain-caused defects characteristic of epitaxially grown Silicon On Sapphire.

The advantages of the silicon on sapphire bond of the invention over other silicon on insulator technologies is the invention's use of a sapphire substrate. As sapphire is an insulator, there will be very little parasitic capacitance in electronic circuitry fabricated on the silicon.

Another advantage of the sapphire substrate is that, once the bonded wafer is etched to leave islands of silicon, thin silicon can be epitaxially grown on the sapphire substrate. By this technique, bipolar circuitry can be integrated in the bonded silicon having all the favorable qualities of bipolar devices, and, in addition, field effect transistors can be fabricated in the epitaxially grown thin film of silicon. Combining the use of bipolar and complementary metal oxide semiconductor (CMOS) transistors on the same substrate is known as BiCMOS. This technology accomplishes a better trade-off of speed and power consumption when compared to the bipolar or CMOS technologies individually.

An additional advantage of using sapphire is that it is transparent over a wide range of optical wavelengths, from ultraviolet to mid-infrared. This permits backside illuminated charged coupled devices or photo-conductive switches, for example, to be fabricated of the silicon on sapphire material. Sapphire is also useful as a substrate for thin film superconductors.

Of course there are numerous ways in which the basic method of bonding silicon wafers to sapphire may be extended for different applications.

Obviously, many modifications and variations of the invention are possible in light of the above teachings. It is therefore to be understood that within the scope of the appended claims the invention may be practiced otherwise than as has been specifically described.

What is claimed is:

1. A method for bonding silicon to sapphire without the addition of heat and comprising the steps of:
   directly polishing one side of a sapphire wafer to a mirror surface;
   directly polishing one side of a silicon wafer to a mirror surface;
   cleaning said wafers; and
   stacking said wafers so that said mirror surfaces make contact directly without oxide therebetween and without any pressure greater than that due to one wafer resting on another whereby a bond between said silicon wafer and said sapphire wafer is formed.

2. A method according to claim 1 in which the step of cleaning said wafers includes using hydrogen peroxide and ammonium hydroxide.

3. A method according to claim 1 in which said cleaning step is followed by a rinse in de-ionized water followed by a drying step utilizing heated nitrogen.

4. A method according to claim 1 in which said cleaning step further includes using hydrofluoric acid.

5. A method according to claim 4 in which said cleaning step is followed by a rinse in de-ionized water followed by a drying step utilizing heated nitrogen.

6. A method according to claim 1 in which said silicon wafer and said sapphire wafer are not latticed matched.

7. A method according to claim 1 in which said bonding occurs at room temperature.

8. A method according to claim 1 in which said bonded silicon and sapphire wafers are used in an electro-optical environment.

9. A method according to claim 1 further including the step of pressing said wafers together.

10. A method for bonding silicon to sapphire without the addition of heat and comprising the steps of:
    directly polishing one side of a sapphire wafer to a mirror surface;
    directly polishing one side of a silicon wafer to a mirror surface; and
    stacking said wafers so that said mirror surfaces make contact directly without oxide therebetween and without any pressure greater than that: due to one wafer resting on another
    whereby a bond between said silicon wafer and said sapphire wafer is formed.

11. A method for bonding silicon-to-sapphire according to claim 10 in which said bonding occurs at room temperature.

12. A method according to claim 10 in which said bonded silicon and sapphire wafers are used in an electro-optical environment.

13. A method according to claim 10 in which said silicon wafer and said sapphire wafer are not latticed matched.

14. A method according to claim 10 further including the step of pressing said wafers together.

* * * * *